(12) United States Patent
Yanagita et al.

(10) Patent No.: US 12,047,700 B2
(45) Date of Patent: Jul. 23, 2024

(54) IMAGING ELEMENT, DRIVING METHOD, AND ELECTRONIC DEVICE

(71) Applicant: SONY SEMICONDUCTOR SOLUTIONS CORPORATION, Kanagawa (JP)

(72) Inventors: Takeshi Yanagita, Tokyo (JP); Masaaki Takizawa, Kanagawa (JP); Yuuji Nishimura, Kumamoto (JP); Shinichi Arakawa, Kumamoto (JP); Yuugo Nakamura, Nagasaki (JP); Yohei Chiba, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/237,160

(22) Filed: Aug. 23, 2023

(65) Prior Publication Data

US 2023/0396895 A1  Dec. 7, 2023

Related U.S. Application Data

(63) Continuation of application No. 17/839,772, filed on Jun. 14, 2022, now Pat. No. 11,778,349, which is a
(Continued)

(30) Foreign Application Priority Data

Jun. 9, 2015 (JP) ................................. 2015-116650

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14607* (2013.01); *H01L 27/14609* (2013.01);
(Continued)

(58) Field of Classification Search
CPC ...... H04N 25/75; H04N 25/585; H04N 25/65; H04N 25/778; H01L 27/14607;
(Continued)

(56) References Cited

U.S. PATENT DOCUMENTS 9,577,006 B2   2/2017  Itonaga et al.
9,787,923 B2 * 10/2017  Petilli .................... H04N 25/77
(Continued)

FOREIGN PATENT DOCUMENTS

CN    101826537    9/2010
CN    101841635    9/2010
(Continued)

OTHER PUBLICATIONS

International Search Report and Written Opinion for International (PCT) Patent Application No. PCT/JP2016/065591, dated Aug. 9, 2016, 8 pages.
(Continued)

*Primary Examiner* — Abdelaaziz Tissire
(74) *Attorney, Agent, or Firm* — Sheridan Ross PC

(57) ABSTRACT

A pixel is included, the pixel including a photoelectric conversion portion configured to convert incident light to a charge by photoelectric conversion and accumulate the charge, a charge transfer unit configured to transfer the charge generated in the photoelectric conversion portion, a diffusion layer to which the charge is transferred through the charge transfer unit, the diffusion layer having a predetermined storage capacitance, a conversion unit configured to convert the charge transferred to the diffusion layer to a pixel signal, and connection wiring configured to connect the diffusion layer and the conversion unit. The connection wiring is connected to the diffusion layer and the conversion unit through contact wiring extending in a vertical direction with respect to a semiconductor substrate on which the
(Continued)

diffusion layer is formed and is formed closer to the semiconductor substrate than other wiring provided in the pixel.

20 Claims, 11 Drawing Sheets

Related U.S. Application Data continuation of application No. 17/364,227, filed on Jun. 30, 2021, now Pat. No. 11,470,276, which is a continuation of application No. 16/903,735, filed on Jun. 17, 2020, now Pat. No. 11,252,356, which is a continuation of application No. 16/401,853, filed on May 2, 2019, now Pat. No. 10,721,422, which is a continuation of application No. 15/849,448, filed on Dec. 20, 2017, now Pat. No. 10,341,592, which is a continuation of application No. 15/578,761, filed as application No. PCT/JP2016/065591 on May 26, 2016, now Pat. No. 10,728,475.

(51) Int. Cl.
H04N 25/585 (2023.01)
H04N 25/65 (2023.01)
H04N 25/778 (2023.01)

(52) U.S. Cl.
CPC .. *H01L 27/14636* (2013.01); *H01L 27/14645* (2013.01); *H04N 25/585* (2023.01); *H04N 25/65* (2023.01); *H04N 25/778* (2023.01)

(58) Field of Classification Search
CPC ......... H01L 27/14609; H01L 27/14636; H01L 27/14645
See application file for complete search history.

(56) References Cited

U.S. PATENT DOCUMENTS

| | | | | |
|---|---|---|---|---|
| 10,341,592 | B2* | 7/2019 | Yanagita | H04N 25/778 |
| 10,721,422 | B2* | 7/2020 | Yanagita | H01L 27/14636 |
| 10,728,475 | B2 | 7/2020 | Yanagita et al. | |
| 11,252,356 | B2* | 2/2022 | Yanagita | H01L 27/14607 |
| 11,470,276 | B2* | 10/2022 | Yanagita | H04N 25/75 |
| 11,778,349 | B2* | 10/2023 | Yanagita | H01L 27/14609 |
| | | | | 257/229 |
| 2005/0110093 | A1 | 5/2005 | Altice, Jr. et al. | |
| 2005/0110884 | A1 | 5/2005 | Altice, Jr. et al. | |
| 2006/0001751 | A1 | 1/2006 | Abe et al. | |
| 2006/0044439 | A1 | 3/2006 | Hiyama et al. | |
| 2006/0151881 | A1 | 7/2006 | Yamada | |
| 2006/0208161 | A1 | 9/2006 | Okita et al. | |
| 2006/0208291 | A1 | 9/2006 | Koizumi et al. | |
| 2006/0261342 | A1 | 11/2006 | Wells | |
| 2007/0035649 | A1 | 2/2007 | McKee | |
| 2007/0069258 | A1 | 3/2007 | Ahn | |
| 2007/0120982 | A1* | 5/2007 | Oita | H04N 25/59 |
| | | | | 348/E3.018 |
| 2007/0131991 | A1* | 6/2007 | Sugawa | H04N 25/771 |
| | | | | 348/E3.018 |
| 2007/0290238 | A1 | 12/2007 | Adachi | |
| 2008/0036888 | A1 | 2/2008 | Sugawa | |
| 2008/0179495 | A1 | 7/2008 | Shimizu et al. | |
| 2008/0237446 | A1 | 10/2008 | Oshikubo et al. | |
| 2009/0045319 | A1 | 2/2009 | Sugawa et al. | |
| 2009/0219422 | A1 | 9/2009 | Takeuchi et al. | |
| 2009/0261443 | A1 | 10/2009 | Noh | |
| 2010/0026865 | A1 | 2/2010 | Tivarus et al. | |
| 2010/0194958 | A1 | 8/2010 | Honda et al. | |
| 2010/0225776 | A1* | 9/2010 | Taura | H01L 27/14623 |
| | | | | 348/222.1 |
| 2011/0007196 | A1 | 1/2011 | Yamashita et al. | |
| 2011/0080493 | A1 | 4/2011 | Kono et al. | |
| 2011/0127408 | A1 | 6/2011 | Yanagita et al. | |
| 2011/0128400 | A1 | 6/2011 | Wakano et al. | |
| 2012/0153126 | A1 | 6/2012 | Oike et al. | |
| 2013/0033631 | A1 | 2/2013 | Mabuchi | |
| 2013/0033632 | A1 | 2/2013 | Kishi | |
| 2013/0229543 | A1 | 9/2013 | Hashimoto et al. | |
| 2013/0256510 | A1* | 10/2013 | Lyu | H04N 25/585 |
| | | | | 250/206 |
| 2013/0327924 | A1 | 12/2013 | Machida | |
| 2014/0014816 | A1 | 1/2014 | Takeda | |
| 2014/0111664 | A1 | 4/2014 | Kumano | |
| 2014/0132812 | A1 | 5/2014 | Soda | |
| 2015/0215554 | A1 | 7/2015 | Toyoguchi | |
| 2016/0043132 | A1 | 2/2016 | Ihara | |
| 2016/0198110 | A1 | 7/2016 | Ikedo | |
| 2016/0219237 | A1 | 7/2016 | Kobayashi et al. | |
| 2016/0254308 | A1 | 9/2016 | Arakawa | |
| 2016/0261814 | A1 | 9/2016 | Ueda et al. | |
| 2017/0110503 | A1 | 4/2017 | Kato et al. | |
| 2017/0214873 | A1 | 7/2017 | Nishimura et al. | |
| 2017/0221947 | A1 | 8/2017 | Shishido et al. | |
| 2017/0244921 | A1 | 8/2017 | Velichko | |
| 2017/0373107 | A1 | 12/2017 | Koga | |
| 2018/0130834 | A1 | 5/2018 | Lee | |
| 2018/0175091 | A1 | 6/2018 | Jeon et al. | |
| 2019/0014276 | A1 | 1/2019 | Cheung et al. | |
| 2019/0075261 | A1 | 3/2019 | Machida et al. | |
| 2019/0215471 | A1 | 7/2019 | Oh | |
| 2022/0311964 | A1 | 9/2022 | Yanagita et al. | |

FOREIGN PATENT DOCUMENTS

| | | |
|---|---|---|
| CN | 102017150 A | 4/2011 |
| CN | 102036020 | 4/2011 |
| CN | 102196198 A | 9/2011 |
| CN | 102271228 A | 12/2011 |
| CN | 102752559 | 10/2012 |
| CN | 102917185 | 2/2013 |
| CN | 103297724 | 9/2013 |
| CN | 103493475 A | 1/2014 |
| CN | 104135633 A | 11/2014 |
| CN | 108401090 A | 8/2018 |
| JP | 2000-232216 | 8/2000 |
| JP | 2006-073732 | 3/2006 |
| JP | 2006-186187 | 7/2006 |
| JP | 2006-196668 | 7/2006 |
| JP | 2007-235835 | 9/2007 |
| JP | 2008-041689 | 2/2008 |
| JP | 2008-277511 | 11/2008 |
| JP | 2010-206095 | 9/2010 |
| JP | 2011-082768 | 4/2011 |
| JP | 2011-204797 | 10/2011 |
| JP | 2013-034045 | 2/2013 |
| JP | 2013-211832 | 10/2013 |
| JP | 2014-060573 | 4/2014 |
| JP | 2014-112580 | 6/2014 |
| JP | 2014-217011 | 11/2014 |
| JP | 2006-217410 | 8/2016 |
| KR | 10-2009-0110729 | 10/2009 |
| KR | 10-2010-0100622 | 9/2010 |

OTHER PUBLICATIONS

Official Action (No. English translation available) for Japanese Patent Application No. 2017-523571, dated May 12, 2020, 9 pages.
Official Action (with English translation) for Japanese Patent Application No. 2017-523571, dated Dec. 22, 2020, 12 pages.
Official Action (with English translation) for China Patent Application No. 201680031983.2, dated Apr. 6, 2021, 38 pages.
Official Action (with English translation) for Japan Patent Application No. 2017-523571, dated Oct. 13, 2021, 10 pages.
Official Action for U.S. Appl. No. 15/578,761, dated Sep. 5, 2019, 22 pages.
Notice of Allowance for U.S. Appl. No. 15/578,761, dated Mar. 13, 2020, 12 pages.
Corrected Notice of Allowance for U.S. Appl. No. 15/578,761, dated Jun. 15, 2020, 2 pages.

(56) References Cited

OTHER PUBLICATIONS

Official Action for U.S. Appl. No. 15/849,448, dated Jul. 27, 2018, 12 pages.
Notice of Allowance for U.S. Appl. No. 15/849,448, dated Feb. 7, 2019, 9 pages.
Official Action for U.S. Appl. No. 16/401,853, dated Sep. 5, 2019, 22 pages.
Notice of Allowance for U.S. Appl. No. 16/401,853, dated Mar. 10, 2020, 8 pages.
Corrected Notice of Allowance for U.S. Appl. No. 16/401,853, dated Apr. 8, 2020, 6 pages.
Corrected Notice of Allowance for U.S. Appl. No. 16/401,853, dated Jun. 1, 2020, 2 pages.
Official Action for U.S. Appl. No. 16/903,735, dated Jun. 24, 2022, 15 pages.
Notice of Allowance for U.S. Appl. No. 16/903,735, dated Oct. 8, 2021, 9 pages.
Corrected Notice of Allowance for U.S. Appl. No. 16/903,735, dated Oct. 18, 2021, 2 pages.
Notice of Allowance for U.S. Appl. No. 17/364,227, dated May 26, 2022, 10 pages.
Official Action for U.S. Appl. No. 17/839,772, dated Nov. 10, 2022, 20 pages.
Notice of Allowance for U.S. Appl. No. 17/839,772, dated May 23, 2023, 8 pages.

* cited by examiner

IMAGING ELEMENT, DRIVING METHOD, AND ELECTRONIC DEVICE

CROSS REFERENCE TO RELATED APPLICATIONS

This application is a continuation of U.S. patent application Ser. No. 17/839,772 filed Jun. 14, 2022, which is a continuation of U.S. patent application Ser. No. 17/364,227 filed Jun. 30, 2021, now U.S. Pat. No. 11,470,276, which is a continuation of U.S. patent application Ser. No. 16/903,735 filed Jun. 17, 2020, now U.S. Pat. No. 11,252,356, which is a continuation of U.S. patent application Ser. No. 16/401,853 filed May 2, 2019, now U.S. Pat. No. 10,721,422, which is a continuation of U.S. patent application Ser. No. 15/849,448, filed Dec. 20, 2017, now U.S. Pat. No. 10,341,592, which is a continuation of U.S. patent application Ser. No. 15/578,761, filed Dec. 1, 2017, now U.S. Pat. No. 10,728,475, which is a national stage application under 35 U.S.C. 371 and claims the benefit of PCT Application No. PCT/JP2016/065591 having an international filing date of May 26, 2016, which designated the United States, which PCT application claimed the benefit of Japanese Patent Application No. 2015-116650 filed Jun. 9, 2015, the disclosures of which are incorporated herein by reference in their entirety.

TECHNICAL FIELD

The present disclosure relates to an imaging element, a driving method, and an electronic device and particularly relates to an imaging element, a driving method, and an electronic device which can capture a clearer image with lower noise.

BACKGROUND ART

Conventionally, in an electronic device including an imaging function, such as a digital still camera or a digital video camera, a solid-state imaging element, such as a CCD (Charge Coupled Device) and CMOS (Complementary Metal Oxide Semiconductor) image sensor, for example, is used. The solid-state imaging element has a pixel in which a PD (photodiode) performing photoelectric conversion and a plurality of transistors are combined, and an image is constructed on the basis of pixel signals output from the plurality of pixels arranged on an image surface on which an image of a subject is formed.

In the imaging element disclosed in Patent Literature 1, for example, wiring arrangement can be performed in a narrow region by forming wiring connecting a floating diffusion and a gate electrode of an amplification transistor in a silicide formation process in order to enlarge a numerical aperture of the PD.

Further, the imaging element disclosed in Patent Literature 2 can improve an image quality of an image by providing a charge accumulating portion for adding a capacitance to a charge voltage conversion portion on a photodiode so as to overlap a region which light from a subject does not enter in the photodiode.

CITATION LIST

Patent Literature

Patent Literature 1: JP 2006-186187A
Patent Literature 2: JP 2014-112580A

DISCLOSURE OF INVENTION

Technical Problem

Incidentally, further enhancement in functions of the imaging element has been in demand in recent years, and for example, obtainment of clearer images with lower noise even in an environment with low illuminance, such as in the dark, is in demand.

The present disclosure was made in view of such circumstances and enables imaging of a clearer image with lower noise.

Solution to Problem

An imaging element according to a first aspect of the present disclosure includes: a pixel including a photoelectric conversion portion configured to convert incident light to a charge by photoelectric conversion and accumulate the charge, a charge transfer unit configured to transfer the charge generated in the photoelectric conversion portion, a diffusion layer to which the charge is transferred through the charge transfer unit, the diffusion layer having a predetermined storage capacitance, a conversion unit configured to convert the charge transferred to the diffusion layer to a pixel signal, and connection wiring configured to connect the diffusion layer and the conversion unit. The connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

A driving method according to the first aspect of the present disclosure is a driving method of an imaging element including a pixel including a photoelectric conversion portion configured to convert incident light to a charge by photoelectric conversion and accumulate the charge, a charge transfer unit configured to transfer the charge generated in the photoelectric conversion portion, a diffusion layer to which the charge is transferred through the charge transfer unit, the diffusion layer having a predetermined storage capacitance, a conversion unit configured to convert the charge transferred to the diffusion layer to a pixel signal, connection wiring configured to connect the diffusion layer and the conversion unit, and a switching unit configured to switch a storage capacitance for accumulating the charge converted by the conversion unit to the pixel signal, the connection wiring being connected to the diffusion layer and the conversion unit through contact wiring extending in a vertical direction with respect to a semiconductor substrate on which the diffusion layer is formed and being formed closer to the semiconductor substrate than other wiring provided in the pixel, the driving method including: setting conversion efficiency in the transfer transistor to a high conversion rate and performing reading-out of the pixel signal by switching the storage capacitance to a large capacitance by the switching unit; and setting the conversion efficiency in the transfer transistor to a low conversion rate and performing reading-out of the pixel signal by switching the storage capacitance to a small capacitance by the switching unit.

An electronic device according to the first aspect of the present disclosure includes: an imaging element including a pixel including a photoelectric conversion portion configured to convert incident light to a charge by photoelectric conversion and accumulate the charge, a charge transfer unit configured to transfer the charge generated in the photoelectric conversion portion, a diffusion layer to which the charge is transferred through the charge transfer unit, the diffusion layer having a predetermined storage capacitance, a conversion unit configured to convert the charge transferred to the diffusion layer to a pixel signal, and connection wiring configured to connect the diffusion layer and the conversion unit. The connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

According to the first aspect of the present disclosure, a pixel is included, the pixel including a photoelectric conversion portion configured to convert incident light to a charge by photoelectric conversion and accumulate the charge, a charge transfer unit configured to transfer the charge generated in the photoelectric conversion portion, a diffusion layer to which the charge is transferred through the charge transfer unit, the diffusion layer having a predetermined storage capacitance, a conversion unit configured to convert the charge transferred to the diffusion layer to a pixel signal, and connection wiring configured to connect the diffusion layer and the conversion unit. The connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

An imaging element according to a second aspect of the present disclosure includes: a pixel including a plurality of photoelectric conversion portions configured to convert incident light by photoelectric conversion to charges and accumulate the charges and having sensitivities different from each other, a charge transfer unit configured to transfer the charges generated in the photoelectric conversion portions, a diffusion layer to which the charges are transferred through the charge transfer unit, the diffusion layer having a predetermined storage capacitance, a conversion unit configured to convert the charges transferred to the diffusion layer to pixel signals, connection wiring configured to connect the diffusion layer and the conversion unit, and an in-pixel capacitance configured to accumulate a charge transferred from a part of the plurality of photoelectric conversion portions.

A driving method according to the second aspect of the present disclosure is a driving method of an imaging element including a pixel including a plurality of photoelectric conversion portions configured to convert incident light by photoelectric conversion to charges and accumulate the charges and having sensitivities different from each other, a charge transfer unit configured to transfer the charges generated in the photoelectric conversion portions, a diffusion layer to which the charges are transferred through the charge transfer unit, the diffusion layer having a predetermined storage capacitance, a conversion unit configured to convert the charges transferred to the diffusion layer to pixel signals, connection wiring configured to connect the diffusion layer and the conversion unit, and an in-pixel capacitance configured to accumulate a charge transferred from a part of the plurality of photoelectric conversion portions, the driving method including: sequentially transferring pixel signals corresponding to the charges generated in the plurality of respective photoelectric conversion portions to the diffusion layer and performing reading-out of the pixel signals.

An electronic device according to the second aspect of the present disclosure includes: an imaging element including a pixel including a plurality of photoelectric conversion portions configured to convert incident light by photoelectric conversion to charges and accumulate the charges and having sensitivities different from each other, a charge transfer unit configured to transfer the charges generated in the photoelectric conversion portion, a diffusion layer to which the charges are transferred through the charge transfer unit, the diffusion layer having a predetermined storage capacitance, a conversion unit configured to convert the charges transferred to the diffusion layer to pixel signals, connection wiring configured to connect the diffusion layer and the conversion unit, and an in-pixel capacitance configured to accumulate a charge transferred from a part of the plurality of photoelectric conversion portions.

According to the second aspect of the present disclosure, a pixel is included, the pixel including a plurality of photoelectric conversion portions configured to convert incident light by photoelectric conversion to charges and accumulate the charges and having sensitivities different from each other, a charge transfer unit configured to transfer the charges generated in the photoelectric conversion portions, a diffusion layer to which the charges are transferred through the charge transfer unit, the diffusion layer having a predetermined storage capacitance, a conversion unit configured to convert the charges transferred to the diffusion layer to pixel signals, connection wiring configured to connect the diffusion layer and the conversion unit, and an in-pixel capacitance configured to accumulate a charge transferred from a part of the plurality of photoelectric conversion portions. The connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

Advantageous Effects of Invention

According to the first and second aspects of the present disclosure, a favorable image can be captured even in an environment with low illuminance.

MODE(S) FOR CARRYING OUT THE INVENTION

Figure 1:
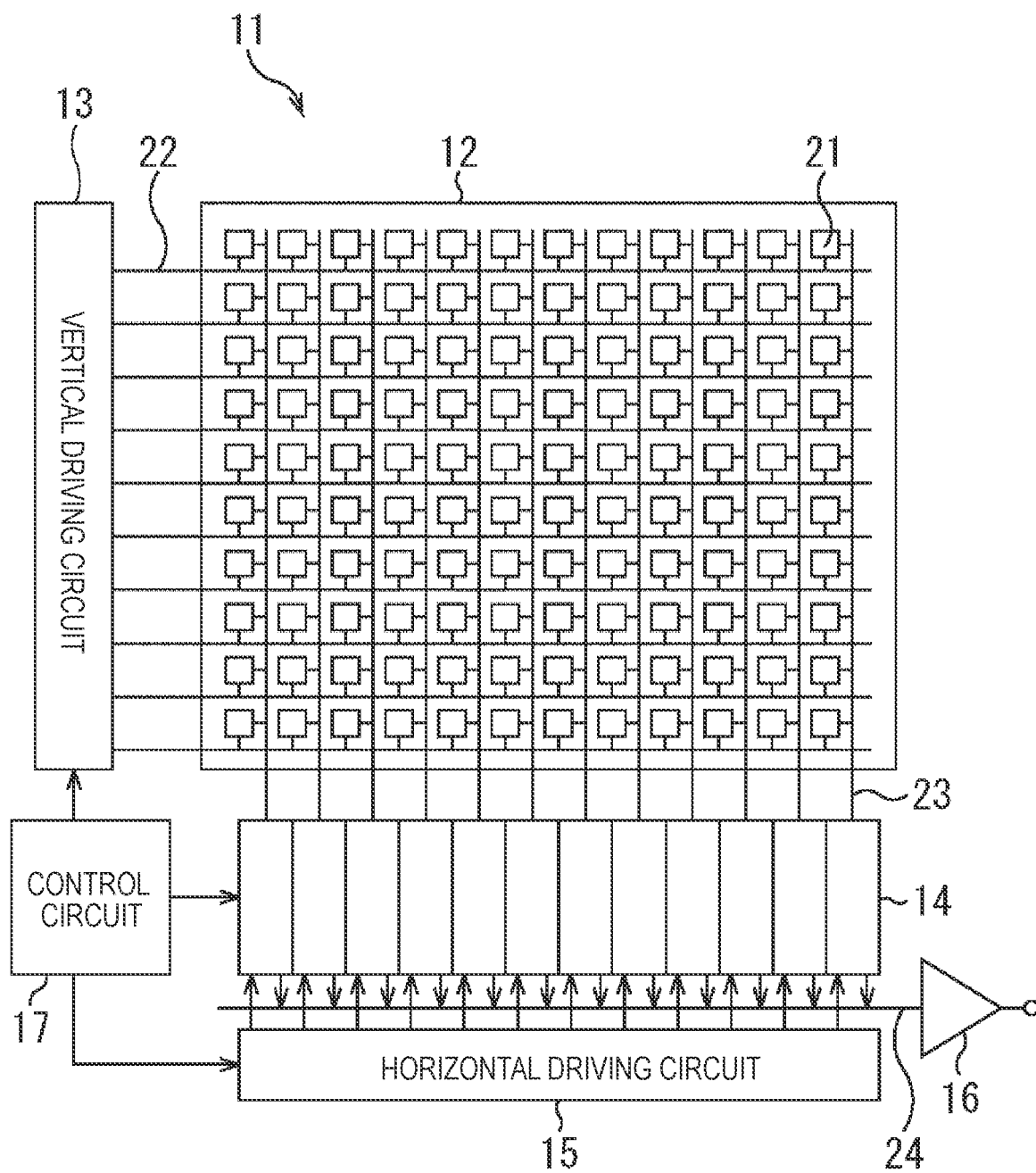
FIG. 1 is a block diagram illustrating a configuration example of an embodiment of an imaging element to which this technology is applied.

Specific embodiments to which this technology is applied will be described below in detail by referring to the drawings.

<Configuration Example of Imaging Element>

FIG. 1 is a block diagram illustrating a configuration example of an embodiment of an imaging element to which this technology is applied.

As illustrated in FIG. 1, an imaging element 11 includes a pixel region 12, a vertical driving circuit 13, a column signal processing circuit 14, a horizontal driving circuit 15, an output circuit 16, and a control circuit 17.

The pixel region 12 is a light receiving surface which receives light collected by an optical system, not shown. In the pixel region 12, a plurality of pixels 21 is arranged in a matrix state, and each of the pixels 21 is connected to the vertical driving circuit 13 for each row through a horizontal signal line 22 and to the column signal processing circuit 14 for each column through a vertical signal line 23. The plurality of pixels 21 outputs pixel signals at a level corresponding to a light amount of the received light, respectively, and an image of a subject formed on the pixel region 12 is constructed from those pixel signals.

The vertical driving circuit 13 supplies a driving signal for driving (transfer, selection, reset and the like) the respective pixels 21 sequentially for each row of the plurality of pixels 21 arranged on the pixel region 12 to the pixel 21 through the horizontal signal line 22. The column signal processing circuit 14 executes AD conversion of the pixel signal and removes reset noise by applying CDS (Correlated Double Sampling) processing to the pixel signal output from the plurality of pixels 21 through the vertical signal line 23.

The horizontal driving circuit 15 supplies a driving signal for causing the column signal processing circuit 14 to output a pixel signal to a data output signal line 24 sequentially for each column of the plurality of pixels 21 arranged on the pixel region 12 to the column signal processing circuit 14. The output circuit 16 amplifies the pixel signal supplied from the column signal processing circuit 14 through the data output signal line 24 at timing according to the driving signal of the horizontal driving circuit 15 and outputs it to a signal processing circuit on a subsequent stage. The control circuit 17 controls driving of each of those blocks by generating and supplying a clock signal according to a driving cycle of each block of the imaging element 11, for example.

In the imaging element 11 configured as above, color filters transmitting lights in red, green, and blue are arranged for each pixel 21 in accordance with a so-called Bayer array, for example, and each of the pixels 21 outputs the pixel signal corresponding to the light amount of light in each color. Moreover, the imaging element 11 can employ a structure of a rear surface type in which the light is incident from a rear surface side of a semiconductor substrate by making a thin film of the semiconductor substrate on which a photodiode constituting the pixel 21 is formed and by laminating wiring layers on a surface of the semiconductor substrate.

<First Configuration Example of Pixel>

Figure 2:
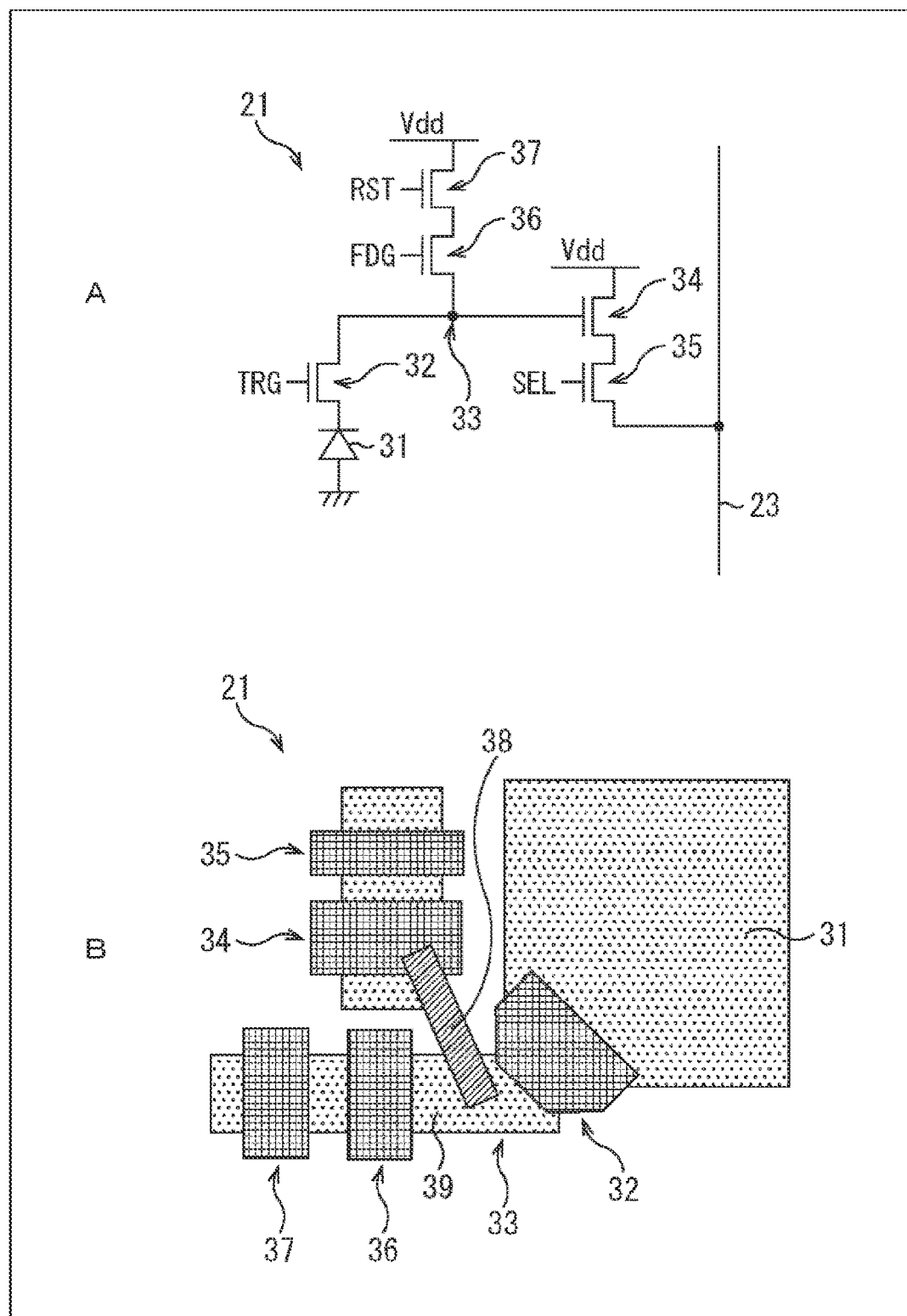
FIG. 2 is a circuit diagram and a plan view illustrating a first configuration example of a pixel.

With reference to FIG. 2, a first configuration example of the pixel 21 will be explained.

In A of FIG. 2, a circuit diagram of the pixel 21 is illustrated, while in B of FIG. 2, planar configuration of the pixel 21 is illustrated.

As illustrated in A of FIG. 2, the pixel 21 includes a PD 31, a transfer transistor 32, an FD (Floating Diffusion) portion 33, an amplification transistor 34, a selection transistor 35, a connection transistor 36, and a reset transistor 37.

The PD 31 is a photoelectric conversion portion for converting incident light to charges by photoelectric conversion and accumulating them, and an anode terminal is grounded, while a cathode terminal is connected to the transfer transistor 32.

The transfer transistor 32 is driven in accordance with a transfer signal TRG supplied from the vertical driving circuit 13, and when the transfer transistor 32 is turned on, the charges accumulated in the PD 31 are transferred to the FD portion 33.

The FD portion 33 is a floating diffusion region having a predetermined storage capacitance connected to the gate electrode of the amplification transistor 34 and accumulates charges transferred from the PD 31. Here, as illustrated in B of FIG. 2, the FD portion 33 has configuration in which a diffusion layer 39 formed on the semiconductor substrate is connected to the gate electrode of the amplification transistor 34 through FD connection wiring 38.

The amplification transistor 34 outputs a pixel signal at a level corresponding to the charges accumulated in the FD portion 33 (that is, a potential of the FD portion 33) to the vertical signal line 23 through the selection transistor 35. That is, by means of the configuration in which the FD portion 33 is connected to the gate electrode of the amplification transistor 34, the FD portion 33 and the amplification transistor 34 function as a conversion portion for converting the charges generated in the PD 31 to the pixel signal at the level corresponding to the charges.

The selection transistor 35 is driven in accordance with a selection signal SEL supplied from the vertical driving circuit 13, and when the selection transistor is turned on, the pixel signal output from the amplification transistor 34 can be output to the vertical signal line 23.

The connection transistor 36 is formed so as to connect the FD portion 33 and the reset transistor 37 and can switch the storage capacitance of the charges to be converted by the amplification transistor 34 to the pixel signal. That is, the connection transistor 36 is driven in accordance with a connection signal FDG supplied from the vertical driving circuit 13, and the storage capacitance of the FD portion 33 is changed by switching on/off of the connection transistor 36. As a result, conversion efficiency in the amplification transistor 34 is switched. That is, when the connection transistor 36 is off, the storage capacitance of the FD portion 33 becomes small, and the conversion efficiency in the amplification transistor 34 is set to high conversion rate. On the other hand, when the connection transistor 36 is on, the storage capacitance of the FD portion 33 becomes large, and the conversion efficiency in the amplification transistor 34 is set to a low conversion rate.

The reset transistor 37 is driven in accordance with a reset signal RST supplied from the vertical driving circuit 13. When the reset transistor 37 is turned on, the charges accumulated in the FD portion 33 is discharged to a drain power supply Vdd through the reset transistor 37 and the connection transistor 36, and the FD portion 33 is reset.

The pixel 21 configured as above can switch the conversion efficiency in the amplification transistor 34 by turning on/off the connection transistor 36. As a result, by switching the conversion efficiency in accordance with an exposure state of the subject, for example, an image with appropriate brightness can be captured.

Figure 3:
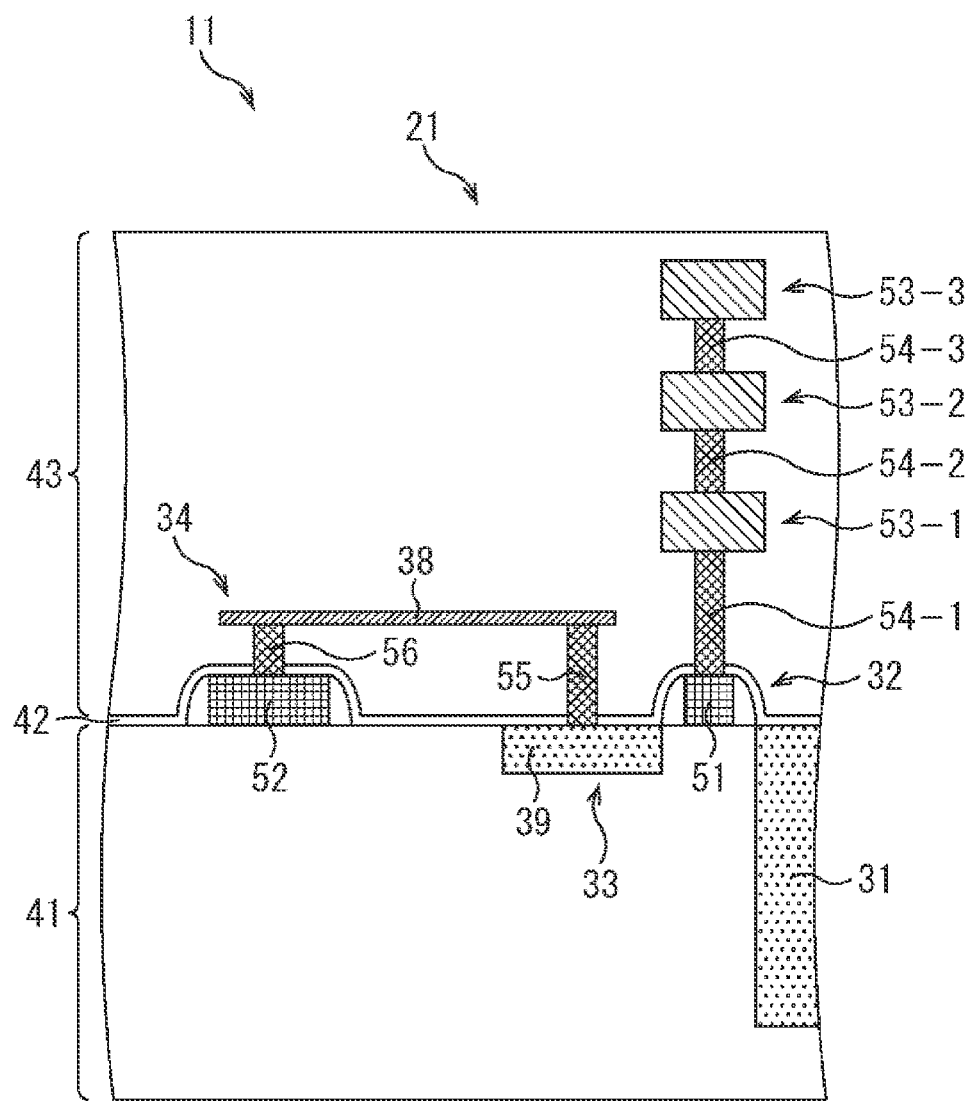
FIG. 3 is a sectional view of the pixel.

Subsequently, FIG. 3 illustrates a part of sectional configuration of the pixel 21.

As illustrated in FIG. 3, the imaging element 11 has a wiring layer 43 laminated through an insulating layer 42 on a semiconductor substrate 41 on which the PD 31, the diffusion layer 39 of the FD portion 33 and the like are formed.

On the semiconductor substrate 41, the diffusion layer 39 is formed by ion-implanting of P-type impurities to an N-type silicon substrate, for example. Moreover, on the semiconductor substrate 41, a gate electrode 51 constituting the transfer transistor 32 and a gate electrode 52 constituting the amplification transistor 34 are laminated. Note that, though not shown, diffusion layers which become a drain and a source constituting the amplification transistor 34 and the selection transistor 35 are formed on the semiconductor substrate 41, similarly to the diffusion layer 39.

The insulating layer 42 is formed by depositing a thin film of silicon dioxide ($SiO_2$), for example, and insulates a surface of the semiconductor substrate 41. Further, though not shown, an insulating layer is also formed between the semiconductor substrate 41 and the gate electrode 51 as well as the gate electrode 52.

The wiring layer 43 is constituted by laminating a plurality of layers of metal wiring 53 through an inter-layer insulating film, and FIG. 3 illustrates a configuration example in which three layers of metal wiring 53-1 to metal wiring 53-3 are laminated. The metal wiring 53-1 to the metal wiring 53-3 are used for input/output of a signal between the pixel 21 and an outside, and a driving signal is input into the pixel 21 through the metal wiring 53-1 to the metal wiring 53-3, and the pixel signal obtained in the pixel 21 is output through the metal wiring 53-1 to the metal wiring 53-3, for example.

Moreover, the laminated metal wiring 53-1 to metal wiring 53-3 are connected through contact wiring 54 formed so as to penetrate the inter-layer insulating film. In the configuration example in FIG. 3, the metal wiring 53-1 is connected to the gate electrode 51 through contact wiring 54-1, the metal wiring 53-2 to the metal wiring 53-1 through contact wiring 54-2, and the metal wiring 53-3 to the metal wiring 53-2 through contact wiring 54-3.

Then, in the wiring layer 43, the diffusion layer 39 in the FD portion 33 is connected to the FD connection wiring 38 through contact wiring 55, and the gate electrode 52 constituting the amplification transistor 34 is connected to the FD connection wiring 38 through contact wiring 56. The contact wiring 55 and the contact wiring 56 are formed so as to extend in a vertical direction with respect to the semiconductor substrate 41 and are formed having a height different from the contact wiring 54-1 connected to the metal wiring 53-1.

Here, the FD connection wiring 38 is formed closer to the semiconductor substrate 41 than the metal wiring 53-1 to the metal wiring 53-3 formed in the wiring layer 43, that is, so as to be a layer lower than the metal wiring 53-1 which is a first layer. That is, the FD connection wiring 38 connecting the diffusion layer 39 and the gate electrode 52 is formed by forming a thinner inter-layer insulating film and forming a metal film with respect to the inter-layer insulating film and performing sputtering before the metal wiring 53 used for connection of the other spots is formed. After that, the inter-layer insulating film is formed to a predetermined thickness so as to form the metal wiring 53-1 which is the first layer, and the metal wiring 53-2 and the metal wiring 53-3 are formed similarly.

Moreover, the FD connection wiring 38 is formed so as to be a thin film having a thickness of 50 nm or less, for example. Moreover, the FD connection wiring 38 can include titanium (Ti), titanium nitride (TiN), tungsten (W), aluminum (Al) or copper (Cu). Moreover, the FD connection wiring 38 may include a lamination structure of titanium and titanium nitride (Ti/TiN/Ti).

In the pixel 21 configured as above, the storage capacitance of the FD portion 33 can be reduced by forming the FD connection wiring 38 as a layer lower than the metal wiring 53-1, and the conversion efficiency in the amplification transistor 34 can be made higher. Moreover, in the pixel 21, the conversion rate of the amplification transistor 34 can be made higher also by forming the FD connection wiring 38 as a thin film.

Moreover, in the pixel 21, as illustrated in B of FIG. 2, by laying out the FD connection wiring 38 so as to avoid planner overlap with the gate electrode of the transfer transistor 32, the connection transistor 36, or the like, generation of a capacitance between the FD connection wiring 38 and the gate electrode can be prevented. Also with this arrangement, the storage capacitance of the FD portion 33 can be reduced.

Particularly, the pixel 21 is configured capable of switching the conversion efficiency in the amplification transistor 34 by the connection transistor 36, and the imaging element 11 can effectively utilize the effect obtained by the reduction in the storage capacitance of the FD portion 33. That is, when the conversion efficiency in the amplification transistor 34 is high, there is a concern that the pixel signal is saturated if an image is captured in a bright circumference. On the other hand, in the case of the imaging element 11, if an image is captured in the bright circumference, since the conversion efficiency in the amplification transistor 34 can be set to be low by turning on the connection transistor 36, saturation of the image signal can be avoided.

Therefore, the imaging element 11 can capture a clear image with lower noise in an environment with low illuminance, such as in the dark, by setting the conversion efficiency in the amplification transistor 34 to be high. Moreover, the imaging element 11 can capture an image with appropriate exposure without saturation of the pixel signal by switching the conversion efficiency in the amplification transistor 34 to be low in an environment with high illuminance, such as during a daytime. As described above, the imaging element 11 can capture a favorable image in any illumination environment and is suitable for use in an application for monitoring or vehicle mount, for example.

Moreover, the imaging element in the aforementioned Patent Literature 1 has a structure in which a parasitic capacitance becomes large by approach of the wiring connected to the FD portion to the substrate, and the imaging element in the aforementioned Patent Literature 2 has a structure in which the parasitic capacitance is generated between the adjacent pieces of wiring. Thus, with the prior-art imaging elements, it has been difficult to achieve high conversion efficiency as with the imaging element 11.

On the other hand, in the imaging element 11, the FD connecting wiring 38 is formed by providing an appropriate interval by the contact wiring 55 and the contact wiring 56 to such a degree that a small parasitic capacitance is generated between the semiconductor substrate 41 and the FD connection wiring 38. Moreover, since the FD connection wiring 38 and the metal wiring 53 are formed separately in different layers, the imaging element 11 can avoid generation of the parasitic capacitance between those pieces of wiring. Thus, as the result that the storage capacitance of the FD portion 33 can be reduced more than before, the high conversion efficiency in the amplification transistor 34 can be achieved.

Moreover, since a barrier metal is formed so that schottky junction cannot be formed, the FD connection wiring 38 can reduce the capacitance generated between that and the semiconductor substrate 41 by performing ohmic junction.

Figure 4:
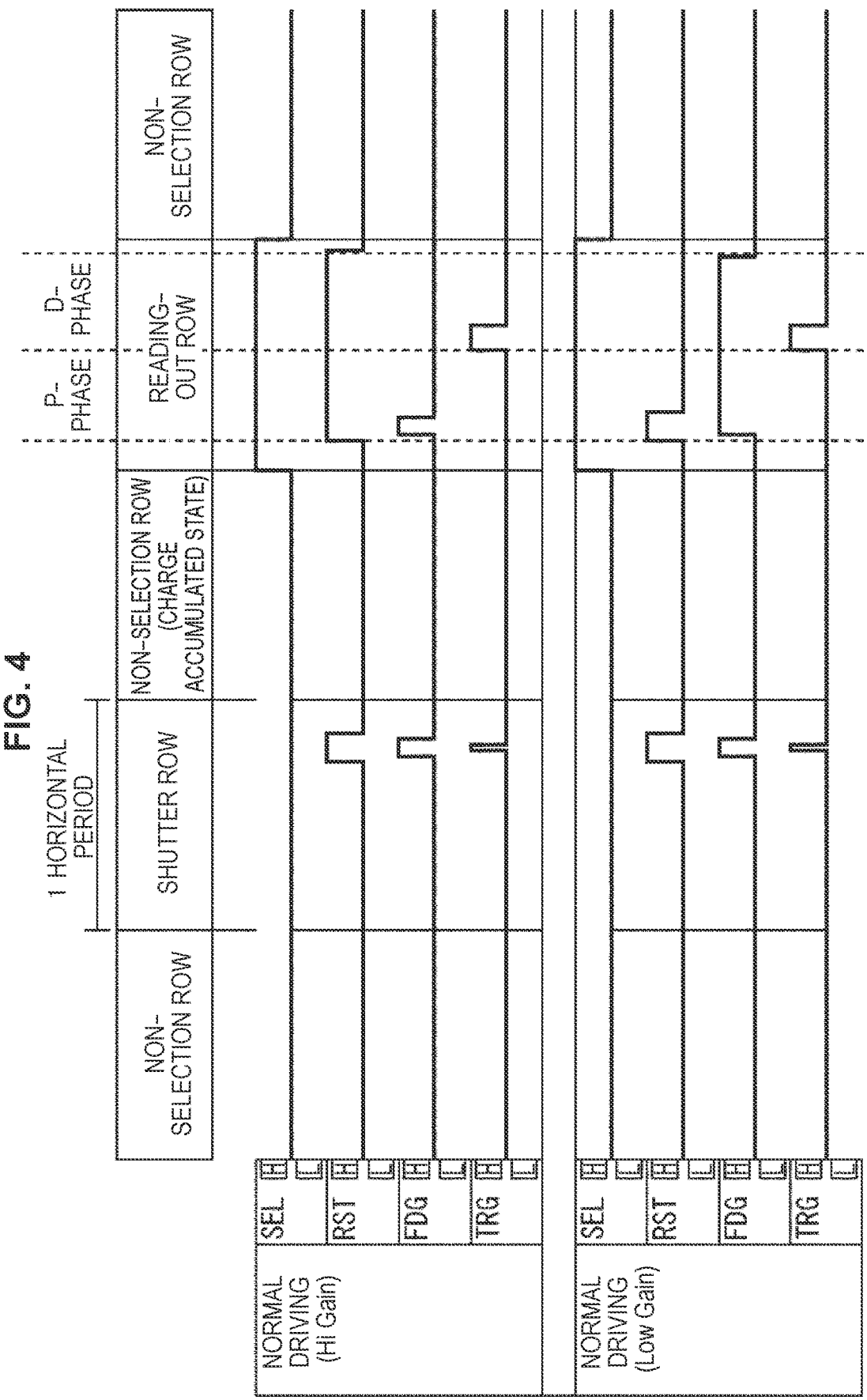
FIG. 4 is a timing chart for explaining a driving method of the pixel.

With reference to FIG. 4, a driving method of the pixel 21 will be explained.

FIG. 4 illustrates a timing chart of the selection signal SEL, the reset signal RST, the connection signal FDG, and the transfer signal TRG used for driving the pixel 21.

First, driving in a case of setting to a high conversion rate (Hi Gain) illustrated on an upper side in FIG. 4 will be explained.

In a state where a row where the pixel 21 is arranged is not selected as a row for performing a shutter operation and a reading-out operation, for example (hereinafter, referred to as non-selection), the selection signal SEL, the reset signal RST, the connection signal FDG, and the transfer signal TRG are all set to an L level.

Then, when the row where the predetermined pixel 21 is arranged becomes a shutter row, in 1 horizontal period during which the row is driven, first, the reset signal RST goes to an H level for only a predetermined period, and the connection signal FDG goes to the H level only for a period shorter than the predetermined period. As a result, the FD portion 33 is connected to the drain power supply Vdd through the connection transistor 36 and the reset transistor 37, and the charges accumulated in the FD portion 33 are discharged to the drain power supply Vdd. Then, in the period during which the connection signal FDG is at the H level, when the transfer signal TRG goes to the H level in a pulse state, the charges accumulated in the PD 31 are discharged, and accumulation of charges by the PD 31 is started.

In parallel with the shutter operation as above performed for the other rows, the pixel 21 in the non-selection row enters a state of accumulating the charges generated in the PD 31. Note that, in FIG. 4, the 1 horizontal period for a plurality of rows performed sequentially is expressed as one horizontal period.

After that, when the row where the predetermined pixel 21 is arranged becomes a reading-out row, first, the selection signal SEL goes to the H level over the 1 horizontal period, and the amplification transistor 34 is connected to the vertical signal line 23 through the selection transistor 35. Then, the reset signal RST goes to the H level, the connection signal FDG goes to the H level in the pulse state, and the FD portion 33 is reset, and then, the pixel signal at the reset level is read out (P-phase). Subsequently, the transfer signal TRG goes to the H level in the pulse state, and the charges accumulated in the PD 31 are transferred to the FD portion 33, and the pixel signal at a data level is read out (D-phase).

Moreover, in the case of setting to a low conversion rate (Low Gain) indicated on a lower side in FIG. 4, the driving similar to the case of setting to the high conversion rate (Hi Gain) is performed in the non-selection row and the shutter row.

Then, in the case of setting to the low conversion rate (Low Gain), when the row where the predetermined pixel 21 is arranged becomes the reading-out row, first, the selection signal SEL goes to the H level over the 1 horizontal period, and the amplification transistor 34 is connected to the vertical signal line 23 through the selection transistor 35. After that, the reset signal RST goes to the H level and then, the connection signal FDG goes to the H level, and the pixel signal at the reset level is read out (P-phase) while the connection transistor 36 is kept on. Moreover, while the connection signal FDG is kept at the H level, the transfer signal TRG goes to the H level in the pulse state, the charges accumulated in the PD 31 are transferred to the FD portion 33, the pixel signal at the data level is read out (D-phase), and after that, the connection signal FDG goes to an L level.

As described above, when the pixel 21 is set to the high conversion rate, after the connection signal FDG goes to the H level in the pulse state and the FD portion 33 is reset, the connection transistor 36 is turned off, and the P-phase and the D-phase are read out in a state where the storage capacitance of the FD portion 33 is small. On the other hand, when the pixel 21 is set to the low conversion rate, the connection transistor 36 is kept on, and the P-phase and the D-phase are read out in a state where the storage capacitance of the FD portion 33 is large.

By means of the driving method as above, the pixel 21 can switch between the high conversion rate and the low conversion rate and can read out a pixel signal at appropriate conversion efficiency in accordance with an exposure state. That is, by turning on the connection transistor 36 by switching the storage capacitance of the FD portion 33 by the connection transistor 36, the conversion efficiency in the amplification transistor 34 is set to the high conversion rate, and the pixel signal can be read out, and by turning off the connection transistor 36, the conversion efficiency in the amplification transistor 34 is set to the low conversion rate, and the pixel signal can be read out.

Note that the pixel 21 employing the FD connection wiring 38 as illustrated in FIG. 3 is not limited to a configuration capable of changing an amplification rate of the amplification transistor 34 by using the connection transistor 36 but it may be a configuration not including the connection transistor 36.

<Second Configuration Example of Pixel>

Subsequently, with reference to FIG. 5, a second configuration example of the pixel 21 will be explained.

Figure 5:
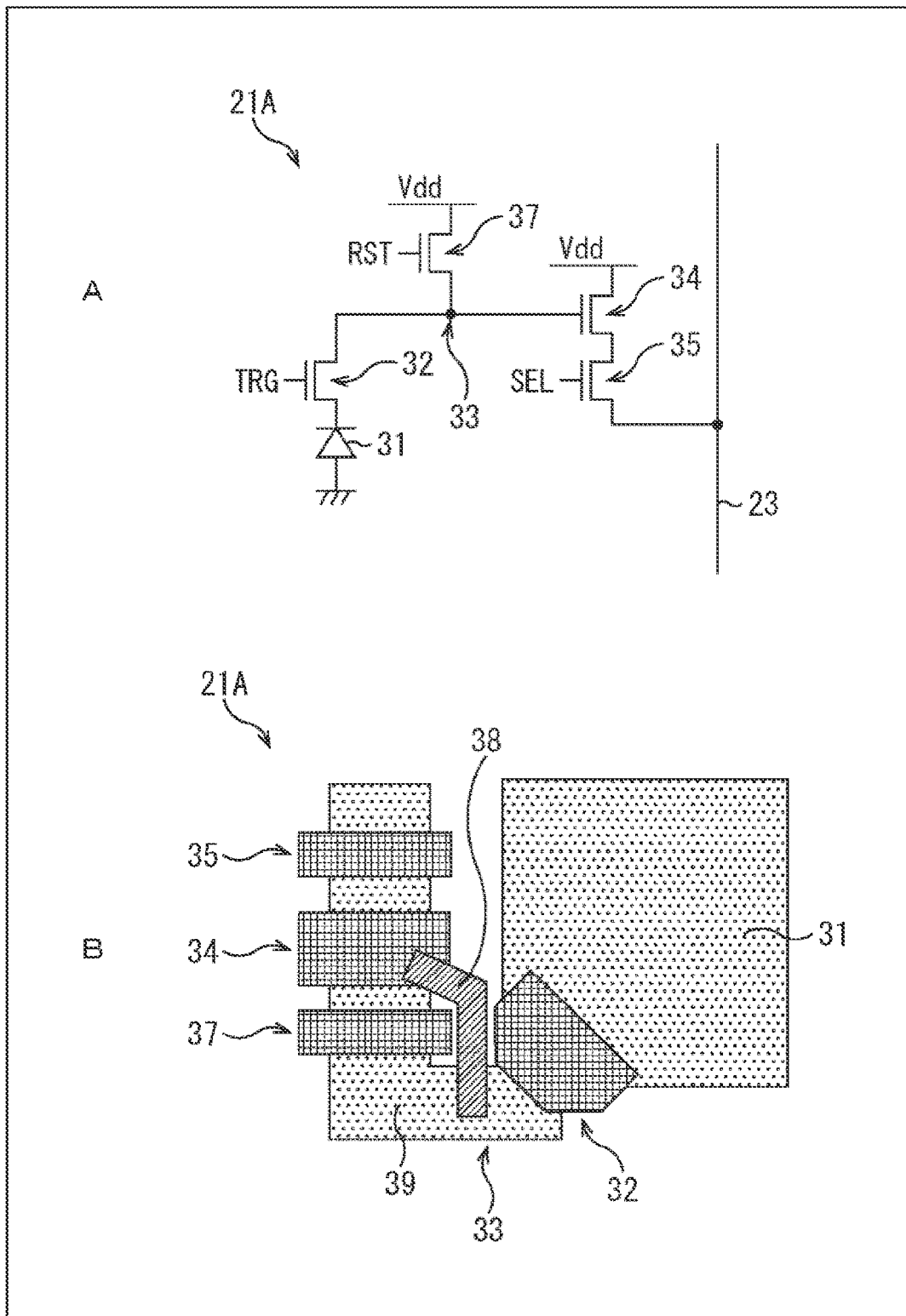
FIG. 5 is a circuit diagram and a plan view illustrating a second configuration example of the pixel.

In A of FIG. 5, a circuit diagram of a pixel 21A is illustrated, while in B of FIG. 5, a planar configuration of the pixel 21A is illustrated. In the pixel 21A illustrated in FIG. 5, common reference numerals are given to a configuration in common with the pixel 21 in FIG. 2, and the detailed explanation will be omitted.

As illustrated in A of FIG. 5, the pixel 21A includes the PD 31, the transfer transistor 32, the FD portion 33, the amplification transistor 34, the selection transistor 35, and the reset transistor 37. That is, the pixel 21A has a configuration in which the connection transistor 36 is excluded from the pixel 21 in FIG. 2.

Moreover, as illustrated in B of FIG. 5, the diffusion layer 39 in the FD portion 33 is connected to the gate electrode of the amplification transistor 34 through the FD connection wiring 38, and the FD connection wiring 38 is laid out so as not to overlap the gate electrode of the transfer transistor 32 or the reset transistor 37.

As described above, the pixel 21A has a structure (4Tr structure) including four transistors, that is, the transfer transistor 32, the amplification transistor 34, the selection transistor 35, and the reset transistor 37. Then, the pixel 21A is formed such that the FD connection wiring 38 connecting the diffusion layer 39 in the FD portion 33 and the gate electrode of the amplification transistor 34 becomes a layer lower than the metal wiring 53-1 as described with reference to FIG. 3. As a result, in the pixel 21A, the conversion efficiency in the amplification transistor 34 can be made high similarly to the pixel 21 in FIG. 2.

Note that the pixel 21 may employ a structure (3Tr structure) including three transistors, that is, the transfer transistor 32, the amplification transistor 34, and the selection transistor 35 without including the selection transistor 35, for example.

Figure 6:
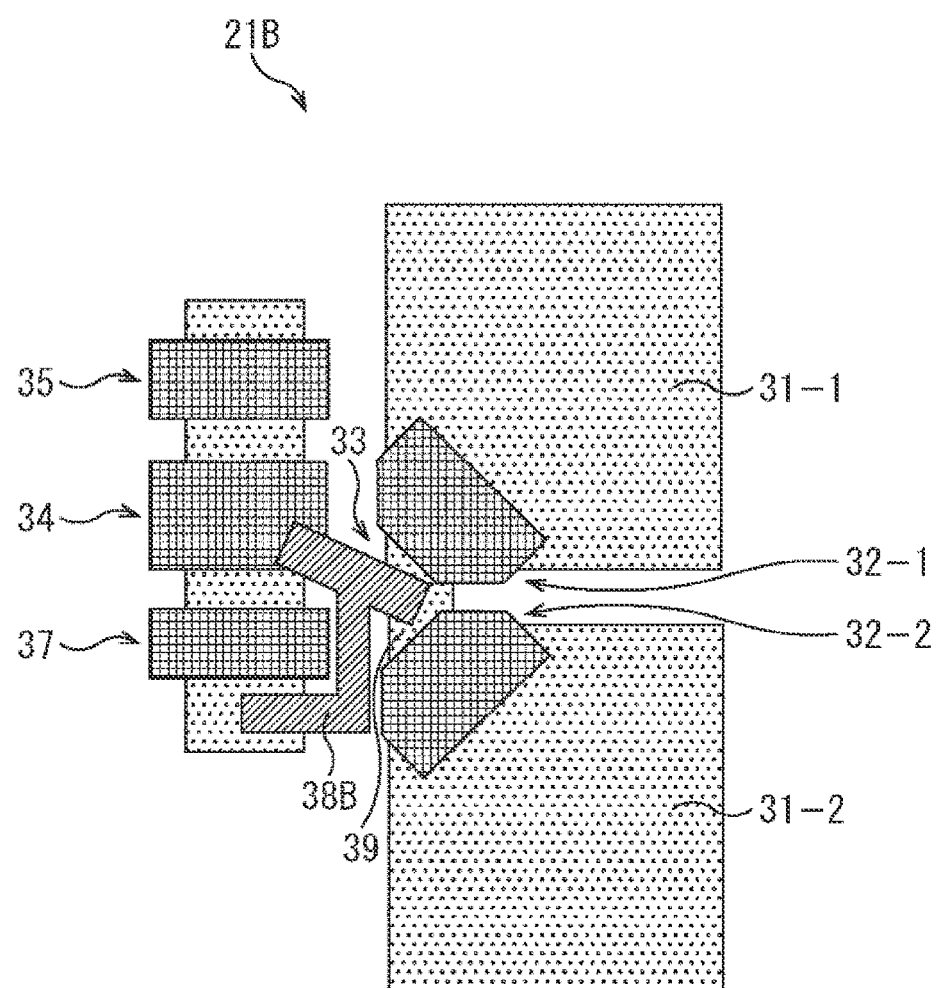
FIG. 6 is a plan view illustrating a third configuration example of the pixel.
Figure 7:
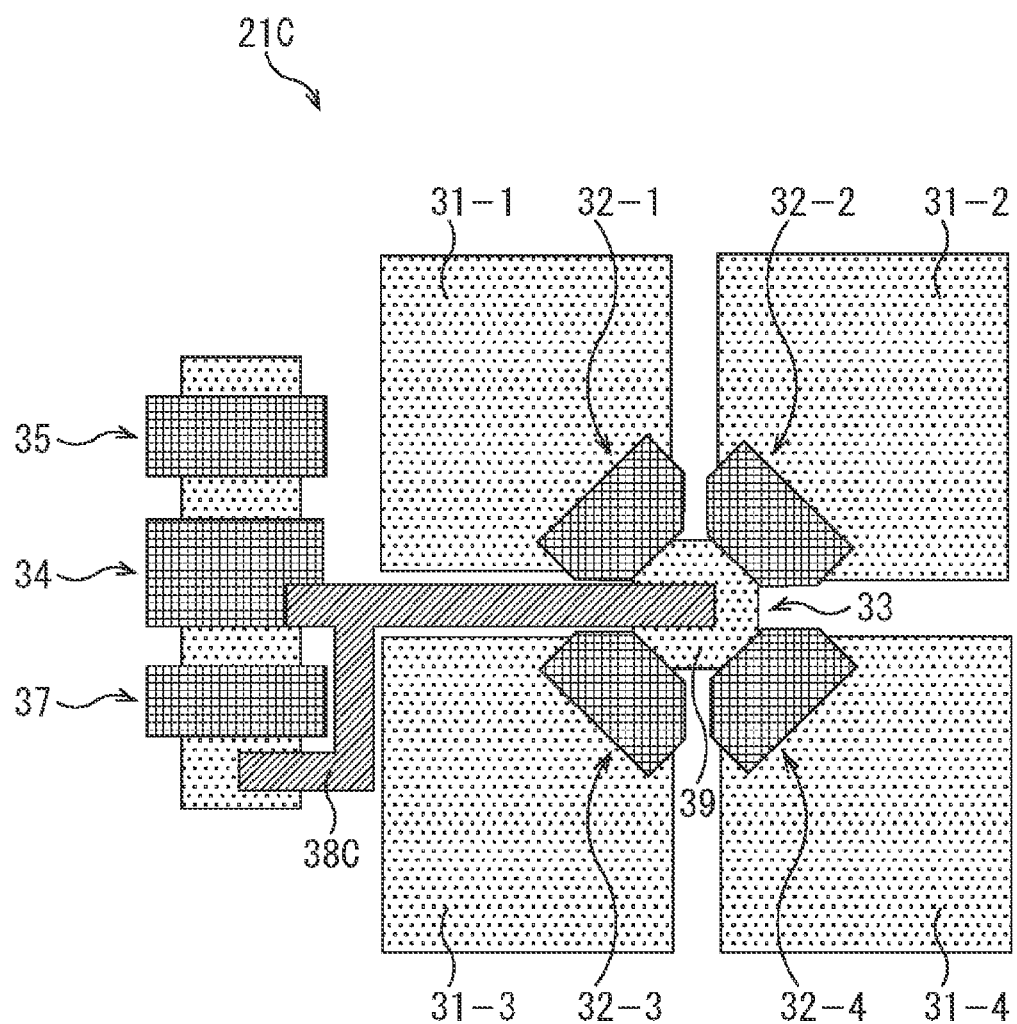
FIG. 7 is a plan view illustrating a fourth configuration example of the pixel.

Moreover, the pixel 21 may employ a pixel sharing structure in which a plurality of the PD 31 shares the FD portion 33, the amplification transistor 34, the selection transistor 35, and the reset transistor 37 as illustrated in FIGS. 6 and 7 which will be described later.

<Third Configuration Example of Pixel>

Subsequently, with reference to FIG. 6, a third configuration example of the pixel 21 will be explained.

FIG. 6 illustrates a planar configuration of a pixel 21B. In the pixel 21B illustrated in FIG. 6, common reference numerals are given to a configuration in common with the pixel 21 in FIG. 2, and the detailed explanation will be omitted.

As illustrated in FIG. 6, the pixel 21B includes two PDs 31-1 and 31-2, two transfer transistors 32-1 and 32-2, the FD portion 33, the amplification transistor 34, the selection transistor 35, and the reset transistor 37. That is, the pixel 21B employs a 2-pixel sharing structure sharing the amplification transistor 34 by the two PDs 31-1 and 31-2.

Moreover, as illustrated in FIG. 6, FD connection wiring 38B is formed so as to connect the diffusion layer 39 in the FD portion 33 and the gate electrode of the amplification transistor 34 and to connect the diffusion layer 39 in the FD portion 33 and a source region in the reset transistor 37. At this time, the FD connection wiring 38B is laid out so as not to overlap the gate electrode of the transfer transistors 32-1 and 32-2, the reset transistor 37, or the like, similarly to the FD connection wiring 38 in FIG. 2.

In the pixel 21B configured as above, too, the FD connection wiring 38B is formed so as to be a layer lower than the metal wiring 53-1 as explained with reference to FIG. 3. As a result, in the pixel 21B, the conversion efficiency in the amplification transistor 34 can be made high similarly to the pixel 21 in FIG. 2.

<Fourth Configuration Example of Pixel>

Subsequently, with reference to FIG. 7, a fourth configuration example of the pixel 21 will be explained.

FIG. 7 illustrates a planar configuration of a pixel 21C. In the pixel 21C illustrated in FIG. 7, common reference numerals are given to a configuration in common with the pixel 21 in FIG. 2, and the detailed explanation will be omitted.

As illustrated in FIG. 7, the pixel 21C includes two PDs 31-1 to 31-4, four transfer transistors 32-1 to 32-4, the FD portion 33, the amplification transistor 34, the selection transistor 35, and the reset transistor 37. That is, the pixel 21C employs a 4-pixel sharing structure sharing the amplification transistor 34 by the four PDs 31-1 to 31-4.

Moreover, as illustrated in FIG. 7, FD connection wiring 38C is formed so as to connect the diffusion layer 39 in the FD portion 33 and the gate electrode of the amplification transistor 34 and to connect the diffusion layer 39 in the FD portion 33 and a source region in the reset transistor 37. At this time, the FD connection wiring 38C is laid out so as not to overlap the gate electrode of the transfer transistors 32-1 to 32-4, the reset transistor 37, or the like, similarly to the FD connection wiring 38 in FIG. 2.

In the pixel 21C configured as above, too, the FD connection wiring 38C is formed so as to be a layer lower than the metal wiring 53-1 as explained with reference to FIG. 3.

As a result, in the pixel 21C, the conversion efficiency in the amplification transistor 34 can be made high similarly to the pixel 21 in FIG. 2.

<Fifth Configuration Example of Pixel>

Subsequently, with reference to FIG. 8, a fifth configuration example of the pixel 21 will be explained.

Figure 8:
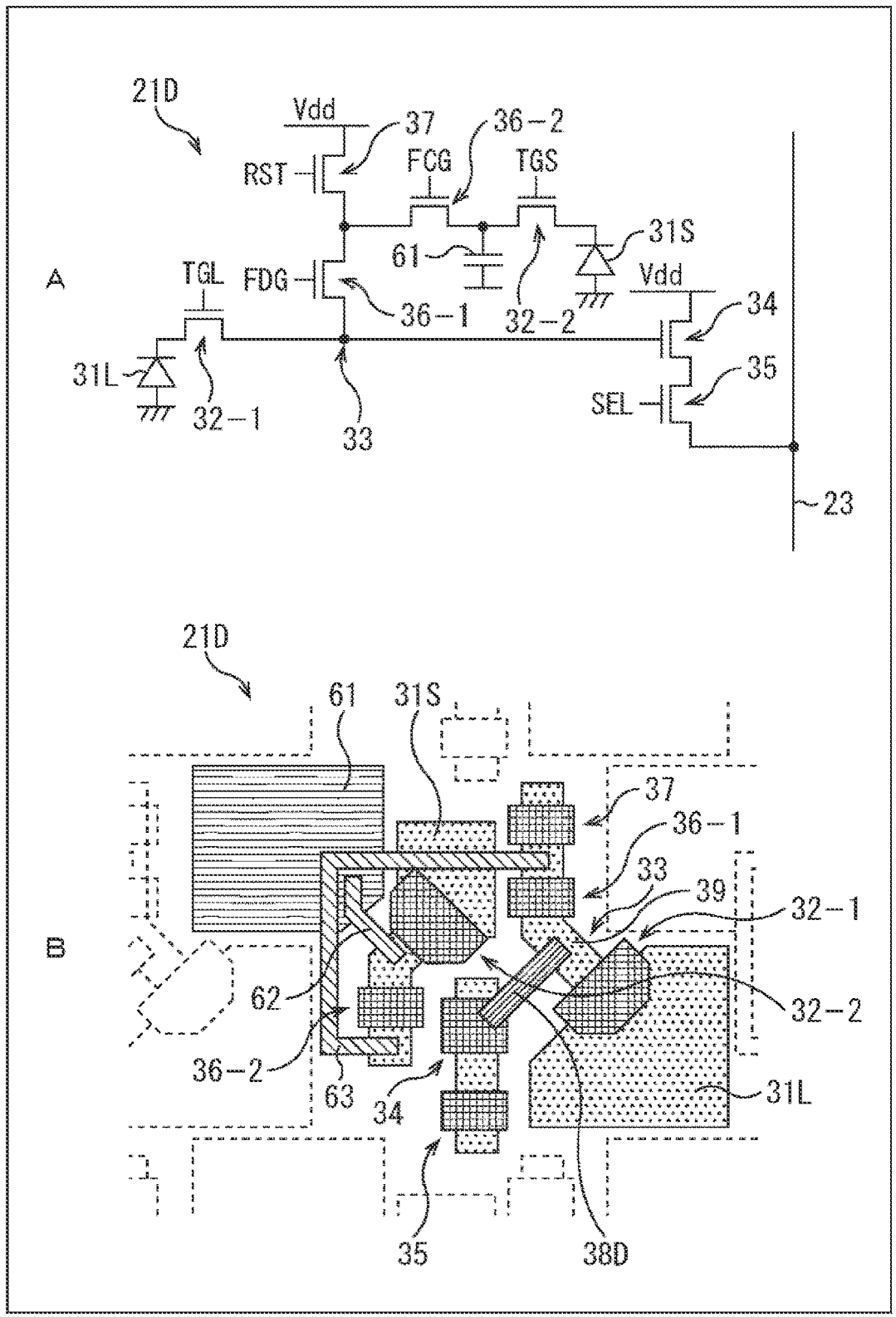
FIG. 8 is a circuit diagram and a plan view illustrating a fifth configuration example of the pixel.

In A of FIG. 8, a circuit diagram of a pixel 21D is illustrated, while in B of FIG. 8, a planar configuration of the pixel 21D is illustrated. In the pixel 21D illustrated in FIG. 8, common reference numerals are given to a configuration in common with the pixel 21 in FIG. 2, and the detailed explanation will be omitted.

As illustrated in A of FIB. 8, a pixel 21D includes a PD 31L and a PD 31S, the two transfer transistors 32-1 and 32-2, the FD portion 33, the amplification transistor 34, the selection transistor 35, two connection transistors 36-1 and 36-2, the reset transistor 37, and an in-pixel capacitance 61.

The PD 31L and the PD 31S are photoelectric conversion portions with sensitivities different from each other and convert the incident lights by photoelectric conversion and accumulate them, respectively. As illustrated in B of FIG. 8, for example, the PD 31L is formed having a large area so as to have high sensitivity, while the PD 31S is formed having a small area so as to have low sensitivity.

The transfer transistor 32-1 is driven in accordance with a transfer signal TGL supplied from the vertical driving circuit 13, and when the transfer transistor 32-1 is turned on, the charges accumulated in the PD 31L are transferred to the FD portion 33.

The transfer transistor 32-2 is driven in accordance with a transfer signal TGS supplied from the vertical driving circuit 13, and when the transfer transistor 32-2 is turned on, the charges accumulated in the PD 31S are transferred to the in-pixel capacitance 61.

The connection transistor 36-1 is formed so as to connect the FD portion 33 and the reset transistor 37, is driven in accordance with the connection signal FDG supplied from the vertical driving circuit 13, and can switch storage capacitance of the FD portion 33.

The connection transistor 36-2 is formed so as to connect the in-pixel capacitance 61 and a connection portion between the connection transistor 36-1 and the reset transistor 37 to each other. The connection transistor 36-2 is driven in accordance with a connection signal FCG supplied from the vertical driving circuit 13, and when the connection transistor 36-2 is turned on, the charges accumulated in the in-pixel capacitance 61 are transferred to the FD portion 33 through the connection transistor 36-1.

The in-pixel capacitance 61 is a capacitor configured by two layers of a metal layer formed in the wiring layer 43 (see FIG. 3), for example, and accumulates charges transferred from the PD 31S.

Note that, for example, wiring 62 connected to the in-pixel capacitance 61 or wiring 63 connecting the connection transistor 36-2 and a diffusion layer between the connection transistor 36-1 and the reset transistor 37 is configured by the metal wiring 53-1 to the metal wiring 53-3 in FIG. 3. Then, similarly to FD connection wiring 38D, the wiring 62 and the wiring 63 are also laid out so as not to overlap the gate electrode of the other transistors in a plan view.

Then, as illustrated in B of FIG. 8, the FD connection wiring 38D connects the diffusion layer 39 in the FD portion 33 and the gate electrode of the amplification transistor 34 to each other and is formed so as to be a layer lower than the metal wiring 53-1 similarly to the FD connection wiring 38 in FIG. 3. As a result, in the pixel 21D, the conversion efficiency in the amplification transistor 34 can be made high similarly to the pixel 21 in FIG. 2.

Particularly, the pixel 21D can suppress noise generated in a pixel signal even in an environment with lower illuminance by forming the FD connection wiring 38D connected to the FD portion 33 to which the charges are transferred from the PD 31L with high sensitivity formed having a large area through the transfer transistor 32-1 so as to become a low layer. That is, in the imaging element 11 including the pixel 21D can capture an image with higher sensitivity by combining characteristics of both higher sensitivity by the PD 31L and higher sensitivity by the FD connection wiring 38D. Moreover, in the imaging element 11 including the pixel 21D, a pixel signal obtained from the PD 31S is used for construction of an image in an environment with high illuminance, and imaging can be performed while saturation of the pixel signal is avoided.

As described above, by providing the PD 31L and the PD 31S with different sensitivities, the imaging element 11 including the pixel 21D can capture a favorable image in either of environments with low illuminance and high illuminance.

Subsequently, with reference to FIG. 9, a driving method of the pixel 21D will be explained.

Figure 9:
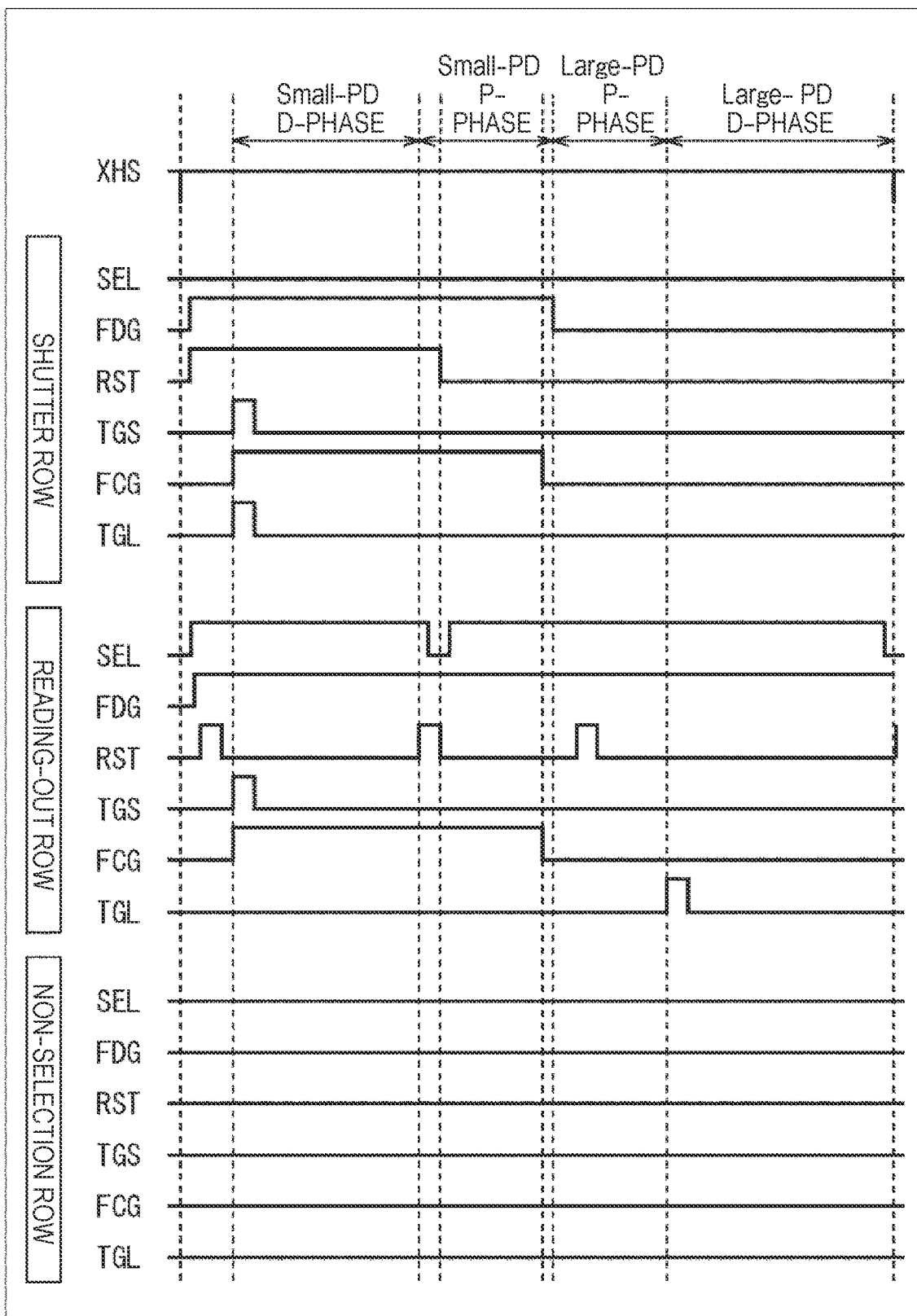
FIG. 9 is a timing chart for explaining a driving method of the pixel.

FIG. 9 illustrates a timing chart of the selection signal SEL, the connection signal FDG, the reset signal RST, the transfer signal TGS, the connection signal FCG, and the transfer signal TGL in each of the shutter row, the reading-out row, and non-selection row.

A horizontal synchronizing signal XHS is a signal for synchronizing an operation in a row where the pixel 21D is arranged in 1 horizontal period.

When the row where the predetermined pixel 21D is arranged becomes a shutter row, first, the connection signal FDG and the reset signal RST go to the H level in the 1 horizontal period during which the row is driven. As a result, the FD portion 33 is connected to the drain power supply Vdd through the connection transistor 36-1 and the reset transistor 37, and the charges accumulated in the FD portion 33 are discharged to the drain power supply Vdd.

Subsequently, the connection signal FCG goes to the H level, and as the result of connection of the in-pixel capacitance 61 to the drain power supply Vdd through the connection transistor 36-2 and the reset transistor 37, the charges accumulated in the in-pixel capacitance 61 are discharged to the drain power supply Vdd. At this time, the transfer signal TRS and the transfer signal TRL go to the H level in the pulse state and thus, the charges accumulated in the PD 31L and the PD 31S are also discharged, and accumulation of the charges by the PD 31L and the PD 31S is started.

After that, the reset signal RST goes to the L level, the connection signal FCG goes to the L level, and the connection signal FDG goes to the L level. Note that, in the shutter row, the selection signal SEL is at the L level at all times.

Then, when the row where the predetermined pixel 21D is arranged becomes the reading-out row, first, the selection signal SEL goes to the H level, and the amplification transistor 34 is connected to the vertical signal line 23 through the selection transistor 35. At the same timing, the connection signal FDG also goes to the H level, and the FD portion 33 enters a state connected to the reset transistor 37. Then, the reset signal RST goes to the H level in the pulse state, and the FD portion 33 is reset and then, at the same timing as the connection signal FCG goes to the H level, the transfer signal TGS is turned on in the pulse state, and the charges accumulated in the PD 31S are transferred to the in-pixel capacitance 61.

As a result, the pixel signal at the data level corresponding to the charges generated in the PD 31S is read out (Small-PD D phase) and then, the reset signal RST goes to the H level in the pulse state, and the pixel signal at the reset level is read out (Small-PD P-phase).

After that, the connection signal FCG goes to the L level, the in-pixel capacitance 61 is disconnected from the FD portion 33, the reset signal RST goes to the H level in the pulse state, the FD portion 33 is reset, and the pixel signal at the reset level is read out (Large-PD P-phase). Then, the transfer signal TGL goes to the H level in the pulse state, and the charges accumulated in the PD 31L are transferred to the FD portion 33 through the transfer transistor 32-1. As a result, the pixel signal at the data level corresponding to the charges generated in the PD 31L is read out (Large-PD D-phase).

Moreover, in the non-selection row, the horizontal synchronizing signal XHS, the selection signal SEL, the connection signal FDG, the reset signal RST, the transfer signal TRS, the connection signal FCG, and the transfer signal TRL are all set to the L level at all times.

By means of the driving method as above, the pixel 21D can perform reading-out of the pixel signals from the PD 31S with low sensitivity and reading-out of the pixel signal from the PD 31L with high sensitivity. Therefore, the imaging element 11 including the pixel 21D can construct an image with a wide dynamic range by using the pixel signal of the PD 31L in an exposure environment where the pixel signal of the PD 31L is not saturated and by using the pixel signal of the PD 31S in the exposure environment where the pixel signal of the PD 31L is saturated.

<Configuration Example of Electronic Device>

Note that the imaging element 11 having the pixel 21 in each of the embodiments as described above can be applied to various electronic devices including an imaging system such as a digital still camera and a digital video camera, a mobile phone having an imaging function or other devices having the imaging function, for example.

Figure 10:
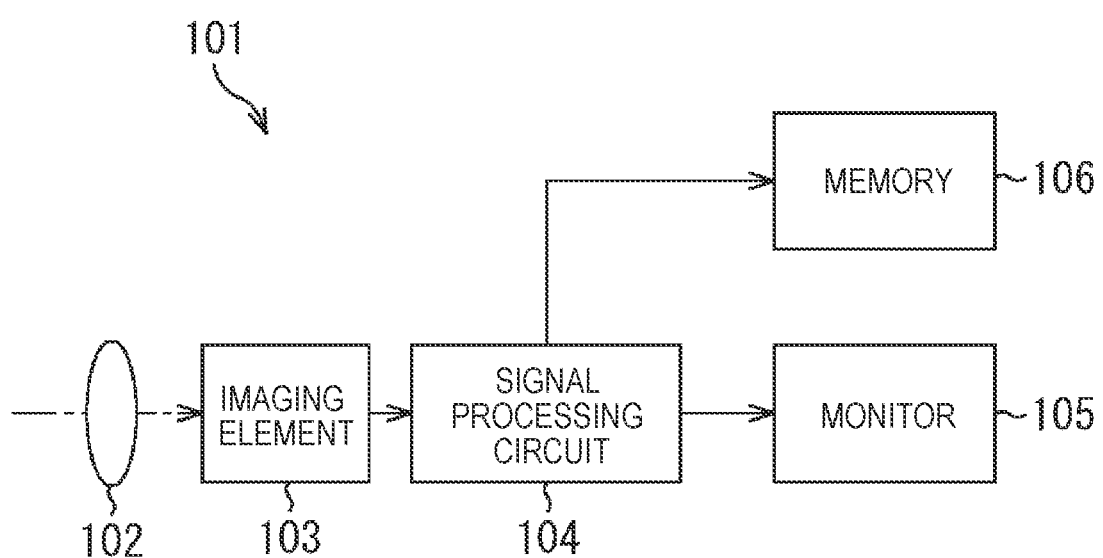
FIG. 10 is a block diagram illustrating an embodiment of an electronic device to which this technology is applied.

FIG. 10 is a block diagram illustrating a configuration example of an imaging device mounted on the electronic device.

As illustrated in FIG. 10, an imaging device 101 includes an optical system 102, an imaging element 103, a signal processing circuit 104, a monitor 105, and a memory 106 and is capable of capturing a still image and a moving image.

The optical system 102 includes one or a plurality of lenses, leads an image light (incident light) from the subject to the imaging element 103, and forms an image on a light receiving surface (sensor portion) of the imaging element 103.

As the imaging element 103, the imaging element 11 having the pixel 21 in each of the aforementioned embodiments is applied. In the imaging element 103, electrons are accumulated for a certain period of time in accordance with an image formed on the light receiving surface through the optical system 102. Then, the signal corresponding to the electrons accumulated in the imaging element 103 is supplied to the signal processing circuit 104.

The signal processing circuit 104 applies various types of signal processing to the pixel signal output from the imaging element 103. An image (image data) obtained by applying the signal processing by the signal processing circuit 104 is supplied to the monitor 105 for display or supplied to the memory 106 for storage (recording).

In the imaging device 101 configured as above, by applying the imaging element 11 having the pixel 21 of each of the aforementioned embodiments, a clearer image can be captured with lower noise.

<Usage Examples of Image Sensor>

Figure 11:
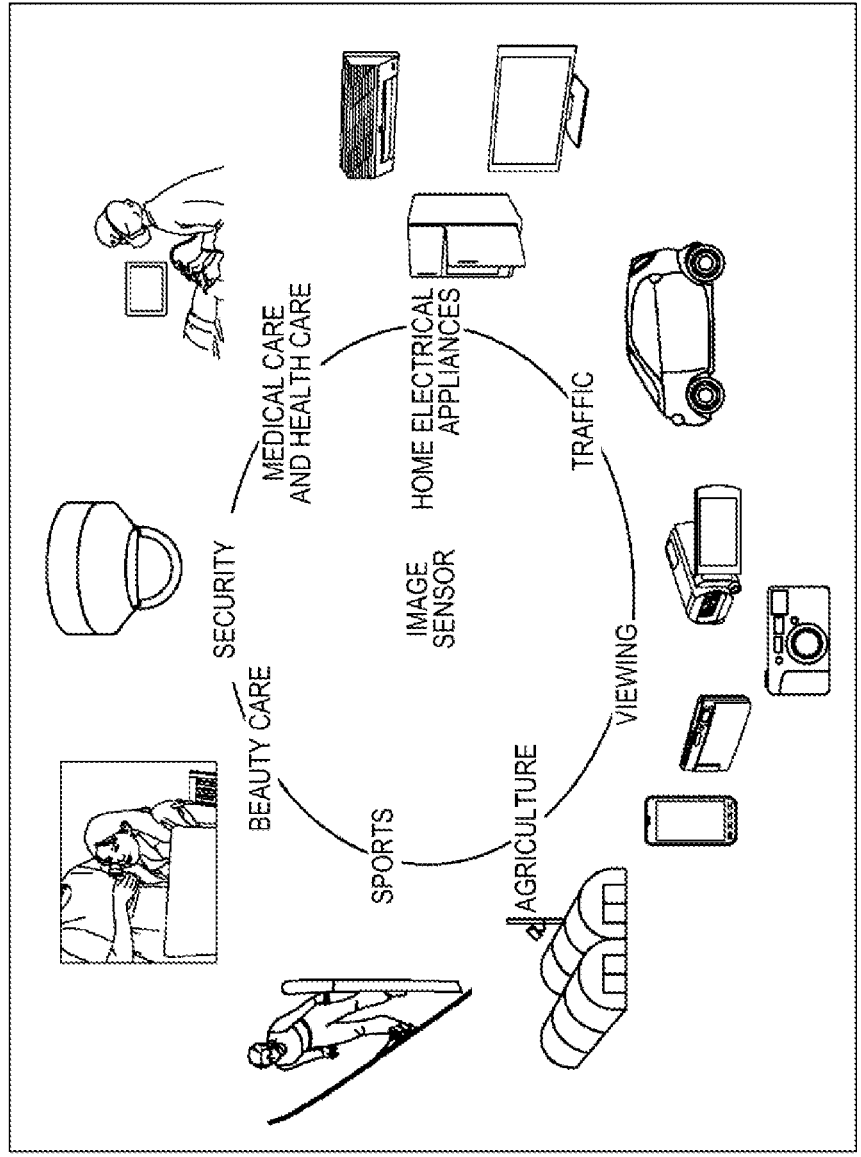
FIG. 11 illustrates usage examples of an image sensor.

FIG. 11 illustrates the usage examples of the above-described image sensor.

The above-described image sensor can be used for, for example, various cases in which light such as visible light, infrared light, ultraviolet light, or X-rays is detected as follows.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

Additionally, the present technology may also be configured as below.

(1)
An imaging element including:
a pixel including
a photoelectric conversion portion configured to convert incident light to a charge by photoelectric conversion and accumulate the charge,
a charge transfer unit configured to transfer the charge generated in the photoelectric conversion portion,
a diffusion layer to which the charge is transferred through the charge transfer unit, the diffusion layer having a predetermined storage capacitance,
a conversion unit configured to convert the charge transferred to the diffusion layer to a pixel signal, and
connection wiring configured to connect the diffusion layer and the conversion unit,
in which the connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

(2)
The imaging element according to (1), in which
the pixel further includes a switching unit configured to switch a storage capacitance for accumulating the charge converted by the conversion unit to the pixel signal.

(3)
The imaging element according to (1) or (2), further including:
a driving unit configured to set conversion efficiency in the transfer transistor to a high conversion rate and perform reading-out of the pixel signal by switching the storage capacitance to a large capacitance by the switching unit, and set the conversion efficiency in the transfer transistor to a low conversion rate and perform reading-out of the pixel signal by switching the storage capacitance to a small capacitance by the switching unit.

(4)
The imaging element according to any of (1) to (3), in which
the connection wiring is formed as a film thinner than the other wiring provided in the pixel.

(5)
The imaging element according to any of (1) to (4), in which
the connection wiring is laid out by avoiding overlap with a gate electrode of a transistor provided in the pixel in a plan view.

(6)
The imaging element according to any of (1) to (5), in which
the connection wiring includes titanium, titanium nitride, tungsten, aluminum or copper or a lamination structure of titanium and titanium nitride.

(7)
The imaging element according to (1), in which
the pixel includes a plurality of photoelectric conversion portions having sensitivities different from each other.

(8)
The imaging element according to (7), further including:
a driving unit configured to sequentially transfer pixel signals corresponding to charges generated in the plurality of respective photoelectric conversion portions to the diffusion layer and perform reading-out of the pixel signals.

(9)
A driving method of an imaging element including a pixel including a photoelectric conversion portion configured to convert incident light to a charge by photoelectric conversion and accumulate the charge, a charge transfer unit configured to transfer the charge generated in the photoelectric conversion portion, a diffusion layer to which the charge is transferred through the charge transfer unit, the diffusion layer having a predetermined storage capacitance, a conversion unit configured to convert the charge transferred to the diffusion layer to a pixel signal, connection wiring configured to connect the diffusion layer and the conversion unit, and a switching unit configured to switch a storage capacitance for accumulating the charge converted by the conversion unit to the pixel signal, the connection wiring being connected to the diffusion layer and the conversion unit through contact wiring extending in a vertical direction with respect to a semiconductor substrate on which the diffusion layer is formed and being formed closer to the semiconductor substrate than other wiring provided in the pixel, the driving method including:

setting conversion efficiency in the transfer transistor to a high conversion rate and performing reading-out of the pixel signal by switching the storage capacitance to a large capacitance by the switching unit; and setting the conversion efficiency in the transfer transistor to a low conversion rate and performing reading-out of the pixel signal by switching the storage capacitance to a small capacitance by the switching unit.

(10)

An electronic device including:

an imaging element including a pixel including
- a photoelectric conversion portion configured to convert incident light to a charge by photoelectric conversion and accumulate the charge,
- a charge transfer unit configured to transfer the charge generated in the photoelectric conversion portion,
- a diffusion layer to which the charge is transferred through the charge transfer unit, the diffusion layer having a predetermined storage capacitance,
- a conversion unit configured to convert the charge transferred to the diffusion layer to a pixel signal, and
- connection wiring configured to connect the diffusion layer and the conversion unit, in which the connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

(11)

An imaging element including:

a pixel including
- a plurality of photoelectric conversion portions configured to convert incident light by photoelectric conversion to charges and accumulate the charges and having sensitivities different from each other,
- a charge transfer unit configured to transfer the charges generated in the photoelectric conversion portions,
- a diffusion layer to which the charges are transferred through the charge transfer unit, the diffusion layer having a predetermined storage capacitance,
- a conversion unit configured to convert the charges transferred to the diffusion layer to pixel signals,
- connection wiring configured to connect the diffusion layer and the conversion unit, and
- an in-pixel capacitance configured to accumulate a charge transferred from a part of the plurality of photoelectric conversion portions.

(12)

The imaging element according to (11), further including:

a driving unit configured to sequentially transfer pixel signals corresponding to the charges generated in the plurality of respective photoelectric conversion portions to the diffusion layer and perform reading-out of the pixel signals.

(13)

The imaging element according to (11) or (12), in which the connection wiring is connected to the diffusion layer and the conversion unit through contact wiring extending in a vertical direction with respect to a semiconductor substrate on which the diffusion layer is formed and is formed closer to the semiconductor substrate than other wiring provided in the pixel.

(14)

The imaging element according to any of (11) to (13), in which the connection wiring is formed as a film thinner than the other wiring provided in the pixel.

(15)

The imaging element according to any of (11) to (14), in which the connection wiring is laid out by avoiding overlap with a gate electrode of a transistor provided in the pixel in a plan view.

(16)

The imaging element according to any of (11) to (15), in which the connection wiring includes titanium, titanium nitride, tungsten, aluminum or copper or a lamination structure of titanium and titanium nitride.

(17)

A driving method of an imaging element including a pixel including a plurality of photoelectric conversion portions configured to convert incident light by photoelectric conversion to charges and accumulate the charges and having sensitivities different from each other, a charge transfer unit configured to transfer the charges generated in the photoelectric conversion portions, a diffusion layer to which the charges are transferred through the charge transfer unit, the diffusion layer having a predetermined storage capacitance, a conversion unit configured to convert the charges transferred to the diffusion layer to pixel signals, connection wiring configured to connect the diffusion layer and the conversion unit, and an in-pixel capacitance configured to accumulate a charge transferred from a part of the plurality of photoelectric conversion portions, the driving method including:

sequentially transferring pixel signals corresponding to the charges generated in the plurality of respective photoelectric conversion portions to the diffusion layer and performing reading-out of the pixel signals.

(18)

An electronic device including:

an imaging element including a pixel including
- a plurality of photoelectric conversion portions configured to convert incident light by photoelectric conversion to charges and accumulate the charges and having sensitivities different from each other,
- a charge transfer unit configured to transfer the charges generated in the photoelectric conversion portion,
- a diffusion layer to which the charges are transferred through the charge transfer unit, the diffusion layer having a predetermined storage capacitance,
- a conversion unit configured to convert the charges transferred to the diffusion layer to pixel signals,
- connection wiring configured to connect the diffusion layer and the conversion unit, and
- an in-pixel capacitance configured to accumulate a charge transferred from a part of the plurality of photoelectric conversion portions.

In addition, embodiments of the present disclosure are not limited to the above-described embodiments, and various alterations may occur insofar as they are within the scope of the present disclosure.

REFERENCE SIGNS LIST 11 imaging element
12 pixel region
13 vertical driving circuit
14 column signal processing circuit
15 horizontal driving circuit 16 output circuit
17 control circuit
21 pixel
22 horizontal signal line
23 vertical signal line
24 data output signal line
31 PD
32 transfer transistor
33 FD portion
34 amplification transistor
35 selection transistor
36 connection transistor
37 reset transistor
38 FD connection wiring
39 diffusion layer
41 semiconductor substrate
42 insulating layer
43 wiring layer
51 and 52 gate electrode
53 metal wiring
54 to 56 contact wiring
61 in-pixel capacitance
62 and 63 wiring

The invention claimed is:

1. A light detecting device, comprising:
a pixel including:
  a first photoelectric converter;
  a first transfer transistor coupled to the first photoelectric converter;
  a first connection transistor coupled to the first transfer transistor;
  a reset transistor coupled to the first connection transistor;
  a second photoelectric converter, wherein a sensitivity of the first photoelectric converter is higher than a sensitivity of the second photoelectric converter;
  a second transfer transistor coupled to the second photoelectric converter;
a capacitance coupled to the second transfer transistor;
  a second connection transistor coupled between the first connection transistor and the second transfer transistors, and
  an amplification transistor coupled to the first transfer transistor and the first connection transistor,
wherein the pixel is configured to:
  read out a first data level signal from the second photoelectric converter in a first period,
  read out a first reset level signal from the second photoelectric converter in a second period,
  read out a second reset level signal from the first photoelectric converter in a third period, and
  read out a second data level signal from the first photoelectric converter in a fourth period.

2. The light detecting device of claim 1, wherein the pixel is configured to read out the first data level signal when the second transfer transistor, the first connection transistor, and the second connection transistor are on.

3. The light detecting device of claim 1, wherein the pixel is configured to read out the first reset level signal after turning on the reset transistor and when the first connection transistor and the second connection transistor are on.

4. The light detecting device of claim 1, wherein the pixel is configured to read out the second reset level signal after turning on the reset transistor and when the first connection transistor is on.

5. The light detecting device of claim 1, wherein the pixel is configured to read out the second data level signal when the first transfer transistor is on.

6. The light detecting device of claim 1, wherein
the second period is after the first period,
the third period is after the second period, and
the fourth period is after the third period.

7. The light detecting device of claim 1, wherein the first and second connection transistors are configured to change a conversion efficiency of the pixel.

8. The light detecting device of claim 1, wherein the capacitance comprises metal.

9. A light detecting device, comprising:
a pixel including:
  a first photoelectric converter;
  a first transfer transistor coupled to the first photoelectric converter;
  a first node coupled to the first transfer transistor;
  a first connection transistor coupled to the first node;
  a reset transistor coupled to the first connection transistor;
  a second photoelectric converter, wherein a sensitivity of the first photoelectric converter is higher than a sensitivity of the second photoelectric converter;
  a second transfer transistor coupled to the second photoelectric converter;
a second node coupled to the second transfer transistor;
  a second connection transistor coupled between the first connection transistor and the second node, and
  an amplification transistor coupled to the first node,
wherein the pixel is configured to:
  read out a first data level signal from the first node and the second node in a first period,
  read out a first reset level signal from the first node and the second node in a second period,
  read out a second reset level signal from the first node in a third period, and
  read out a second data level signal from the first node in a fourth period.

10. The light detecting device of claim 9, further comprising:
a capacitance coupled to the second node.

11. A device, comprising:
a signal processor; and
a light detecting device, comprising:
  a pixel including:
    a first photoelectric converter;
    a first transfer transistor coupled to the first photoelectric converter;
    a first connection transistor coupled to the first transfer transistor;
    a reset transistor coupled to the first connection transistor;
    a second photoelectric converter, wherein a sensitivity of the first photoelectric converter is higher than a sensitivity of the second photoelectric converter;
    a second transfer transistor coupled to the second photoelectric converter;
    a capacitance coupled to the second transfer transistor;
    a second connection transistor coupled between the first connection transistor and the second transfer transistors, and
    an amplification transistor coupled to the first transfer transistor and the first connection transistor, wherein the pixel is configured to:
  read out a first data level signal from the second photoelectric converter in a first period,
  read out a first reset level signal from the second photoelectric converter in a second period,
  read out a second reset level signal from the first photoelectric converter in a third period, and
  read out a second data level signal from the first photoelectric converter in a fourth period.

12. The device of claim 11, wherein
the pixel is configured to read out the first data level signal when the second transfer transistor, the first connection transistor, and the second connection transistor are on.

13. The device of claim 11, wherein
the pixel is configured to read out the first reset level signal after turning on the reset transistor and when the first connection transistor and the second connection transistor are on.

14. The device of claim 11, wherein
the pixel is configured to read out the second reset level signal after turning on the reset transistor and when the first connection transistor is on.

15. The device of claim 11, wherein
the pixel is configured to read out the second data level signal when the first transfer transistor is on.

16. The device of claim 11, wherein
the second period is after the first period,
the third period is after the second period, and
the fourth period is after the third period.

17. The device of claim 11, wherein
the first and second connection transistors are configured to change a conversion efficiency of the pixel.

18. The device of claim 11, wherein
the capacitance comprises metal.

19. The device of claim 11, wherein
in a plan view, the first transfer transistor and the second transistor are diagonally adjacent to one another.

20. The device of claim 11, wherein
the first connection transistor and the second connection transistor are electrically connected to a metal capacitance.

* * * * *